United States Patent
Tsai et al.

(10) Patent No.: US 12,417,795 B2
(45) Date of Patent: Sep. 16, 2025

(54) PHYSICAL LAYER CIRCUIT, WRITE LEVELING TRAINING CIRCUIT AND METHOD FOR CALIBRATING ACCESS CONTROL SIGNAL TRANSMITTED TO MEMORY DEVICE

(71) Applicant: Realtek Semiconductor Corp., HsinChu (TW)

(72) Inventors: Fu-Chin Tsai, HsinChu (TW); Chun-Chi Yu, HsinChu (TW); Chih-Wei Chang, HsinChu (TW); Gerchih Chou, San Jose, CA (US)

(73) Assignee: Realtek Semiconductor Corp., HsinChu (TW)

( * ) Notice: Subject to any disclaimer, the term of this patent is extended or adjusted under 35 U.S.C. 154(b) by 203 days.

(21) Appl. No.: 18/518,575

(22) Filed: Nov. 23, 2023

(65) Prior Publication Data

US 2025/0174258 A1    May 29, 2025

(51) Int. Cl.
*G11C 8/18*    (2006.01)
(52) U.S. Cl.
CPC .................................... *G11C 8/18* (2013.01)
(58) Field of Classification Search
CPC . G11C 8/18; G11C 2207/2254; G11C 29/022; G11C 29/023; G11C 29/028; G11C 7/1093
See application file for complete search history.

(56) References Cited

U.S. PATENT DOCUMENTS

| | | | |
|---|---|---|---|
| 10,522,204 B1* | 12/2019 | Yu ........................ | G11C 29/028 |
| 2003/0026162 A1* | 2/2003 | Matsui ................... | G11C 29/50 365/233.11 |
| 2020/0142844 A1* | 5/2020 | Chi ...................... | G06F 13/1689 |
| 2020/0286535 A1* | 9/2020 | Hwang ................. | G11C 7/1093 |
| 2020/0388320 A1* | 12/2020 | Lee ..................... | G11C 11/4076 |

* cited by examiner

*Primary Examiner* — Khamdan N. Alrobaie
(74) *Attorney, Agent, or Firm* — Winston Hsu (57) ABSTRACT

A physical layer (PHY) circuit, a write leveling training circuit and a method for calibrating an access control signal are provided. The PHY circuit includes the write leveling training circuit, a clock generator and a transmitting (TX) logic. The write leveling training circuit generates at least one phase control signal. The clock generator outputs at least one control clock according to the phase control signal. The TX logic generates the access control signal according to the control clock, wherein a phase of the access control signal is associated with the phase control signal. The memory device outputs a data signal according to a phase error between a memory clock and the access control signal, and the write leveling training circuit determines a target value of the phase control signal according to the data signal, in order to minimize the phase error between the memory clock and the access control signal.

20 Claims, 6 Drawing Sheets

FIG. 6

PHYSICAL LAYER CIRCUIT, WRITE LEVELING TRAINING CIRCUIT AND METHOD FOR CALIBRATING ACCESS CONTROL SIGNAL TRANSMITTED TO MEMORY DEVICE

BACKGROUND OF THE INVENTION

1. Field of the Invention

The present invention is related to access calibration of memory devices, and more particularly, to a physical layer circuit, a write leveling training circuit and a method for calibrating an access control signal transmitted to a memory device.

2. Description of the Prior Art

For operations of a low power double data rate (LPDDR) memory device, it is required to ensure that edges of a data strobe signal or a write clock signal are aligned with that of a clock of the LPDDR memory device (e.g., with a phase error that is sufficient small). In practice, variation in process, package, printed circuit board (PCB) may introduce different parameters of different chips in mass production, making phase errors of these chips be different from one another. In practice, it is not preferred to apply the parameters derived by simulation to all chips, which may result in bad yields and is not acceptable for the mass production.

Thus, there is a need for a novel method and related architecture, which can detect the phase error between the above control signals/clocks and calibrate the phase error to be sufficient small, thereby solving the problem of the related art.

SUMMARY OF THE INVENTION

An objective of the present invention is to provide a physical layer circuit, a write leveling training circuit and a method for calibrating an access control signal transmitted to a memory device (e.g. low power dynamic data rate memory devices), to solve the problem of the related art.

At least one embodiment of the present invention provides a physical layer (PHY) circuit for calibrating an access control signal transmitted to a memory device. The PHY circuit comprises a write leveling training circuit, a clock generator, and a transmitting (TX) logic, wherein the clock generator is coupled to the write leveling training circuit, and the TX logic is coupled to the clock generator. The write leveling training circuit is configured to generate at least one phase control signal. The clock generator is configured to output at least one control clock according to the at least one phase control signal, wherein a phase of the at least one control clock is associated with the at least one phase control signal. The TX logic is configured to generate the access control signal according to the at least one control clock, wherein a phase of the access control signal is associated with the phase of the at least one control clock. In addition, the memory device may output a data signal according to a phase error between a memory clock and the access control signal, and the write leveling training circuit may determine a target value of the at least one phase control signal according to the data signal, in order to minimize the phase error between the memory clock and the access control signal.

At least one embodiment of the present invention provides a write leveling training circuit for calibrating an access control signal transmitted to a memory device. The write leveling training circuit comprises a scan signal controller, a phase control circuit and a result recording circuit, wherein the phase control circuit is coupled to the scan signal controller, and the result recording circuit is coupled to the scan signal controller. The scan signal controller is configured to control operations of the write leveling training circuit. The phase control circuit is configured to output at least one phase control signal according to control of the scan signal controller, wherein a phase of the access control signal is controlled according to the at least one phase control signal, the memory device outputs a data signal according to a phase error between a memory clock and the access control signal. The result recording circuit is configured to receive the data signal from the memory device and record multiple results of the data signal. In addition, the scan signal controller may determine a target value of the at least one phase control signal according to the multiple results of the data signal, in order to minimize the phase error between the memory clock and the access control signal.

At least one embodiment of the present invention provides a method for calibrating an access control signal transmitted to a memory device, wherein the method is applicable to a PHY circuit. The method comprises: utilizing a write leveling training circuit of the PHY circuit to generate at least one phase control signal; utilizing a clock generator of the PHY circuit to output at least one control clock according to the at least one phase control signal, wherein a phase of the at least one control clock is associated with the at least one phase control signal; utilizing a TX logic of the PHY circuit to generate the access control signal according to the at least one control clock, wherein a phase of the access control signal is associated with the phase of the at least one control clock, and the memory device outputs a data signal according to a phase error between a memory clock and the access control signal; and utilizing the write leveling training circuit to determine a target value of the at least one phase control signal according to the data signal, in order to minimize the phase error between the memory clock and the access control signal.

The PHY circuit, the write leveling training circuit and the method provided by the embodiments of the present invention may combine controls of software and hardware for detecting the phase error between the memory clock and the access control clock, and thereby calibrate the phase error within an allowable range. In addition, the embodiment of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
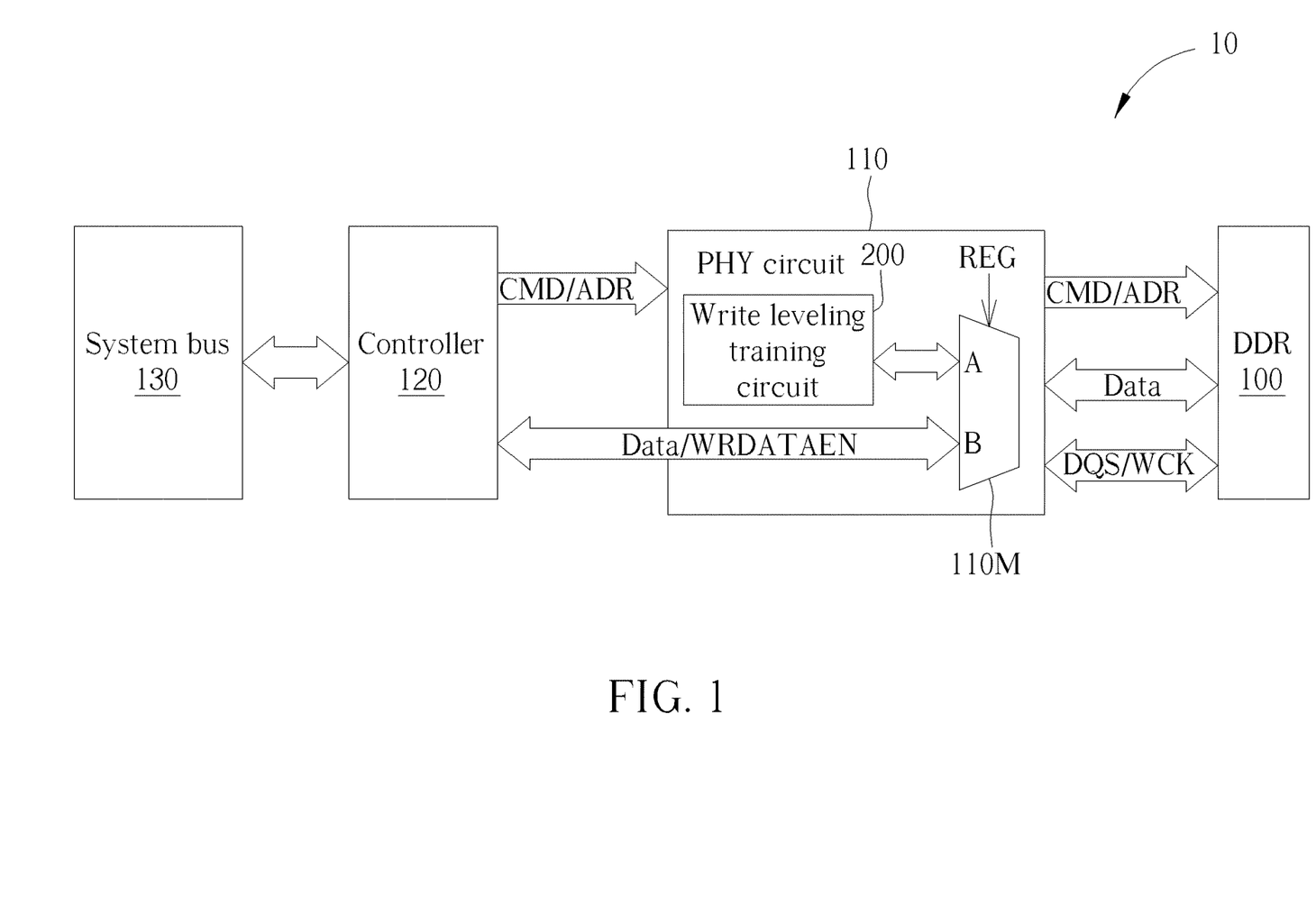
FIG. 1 is a diagram illustrating an electronic device according to an embodiment of the present invention.

FIG. 1 is a diagram illustrating an electronic device 10 according to an embodiment of the present invention. As shown in FIG. 1, the electronic device 10 may comprise a memory device such as a double data rate (DDR) memory device 100 (labeled "DDR" in figures for brevity), a physical layer (PHY) circuit 110, a controller 120 (e.g., a memory controller) and a system bus 130. In this embodiment, the system bus 130 may be configured to support data communication between components (e.g., a central processing unit (CPU) which is not shown, the controller 120, etc.) within the electronic device 10, where the CPU may transmit memory commands to the controller 120, in order to access the DDR memory device 100 via the controller 120. In detail, the controller 120 may transmit commands CMD and addresses ADR to the DDR memory device 100 via the PHY circuit 110. In this embodiment, the controller 120 may access the DDR memory device 100 via the PHY circuit 110, where the PHY circuit 110 is configured to access data of the DDR memory device 100 in hardware level with aid of a data strobe signal DQS or a write clock signal WCK. In this embodiment, the PHY circuit 110 may comprise a write leveling training circuit 200 and at least one selecting circuit such as a selector 110M, where the selector 110M is configured to determine whether to access the DDR memory device 100 with data and control signal(s) such as a write enable signal WRDATAEN from the controller 120 or control signal(s) from the write leveling training circuit 200 according to a register value REG which is written by the CPU or the controller 120. When the DDR memory device 100 is set to be in a normal mode, the CPU may control the controller 120 to access data of the DDR memory device 100 via the PHY circuit 110. When the DDR memory device 100 is set to be in a write leveling training mode, the write leveling training circuit 200 may start related operation to calibrate a phase of the data strobe signal DQS or the write clock signal WCK. As the present invention focuses on write leveling training of the DDR memory device 100, details related to the normal mode (which involves the controller 120) will be omitted in the following descriptions for brevity.

Figure 2:
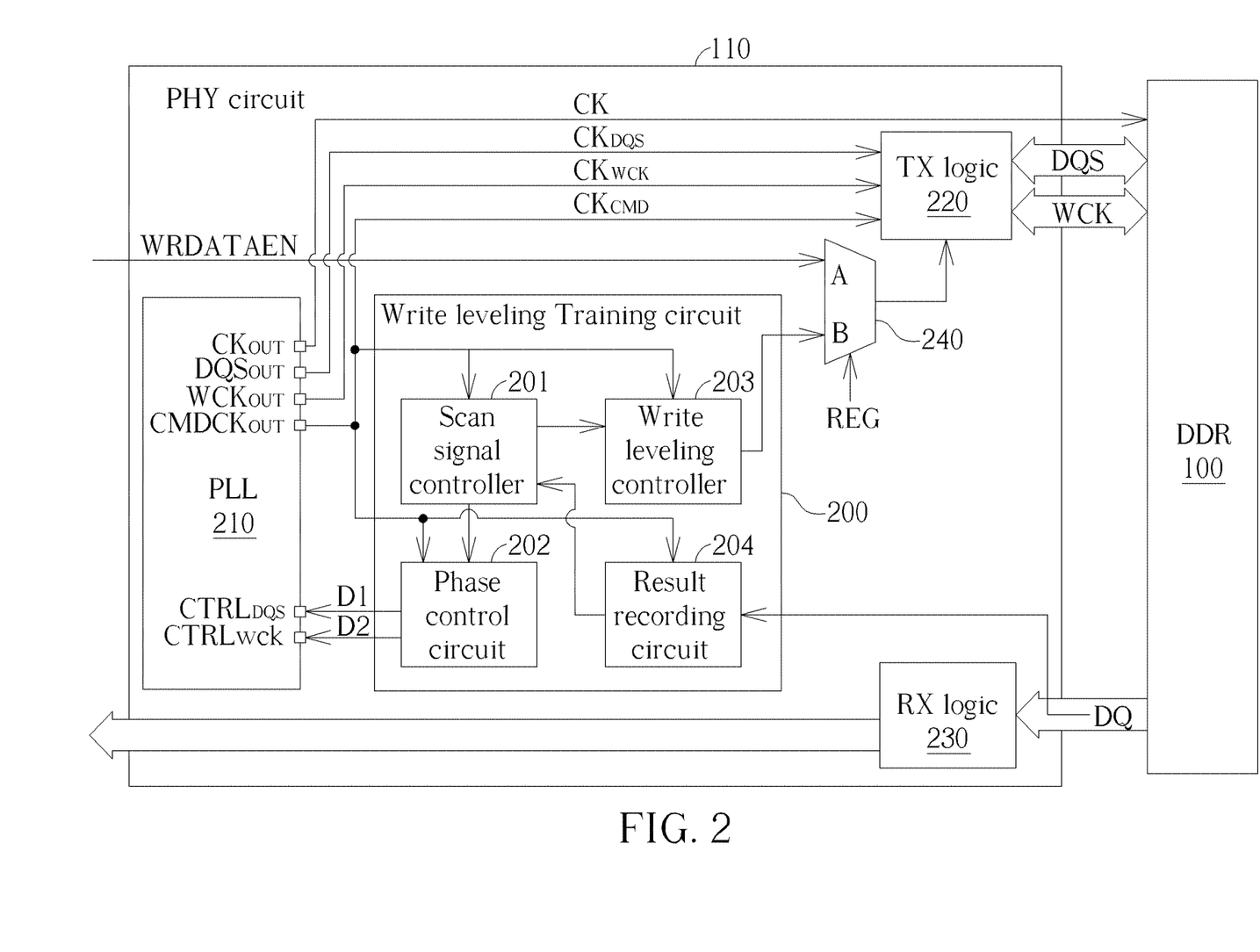
FIG. 2 is a diagram illustrating details of a PHY circuit shown in FIG. 1 according to an embodiment of the present invention.

FIG. 2 is a diagram illustrating details of the PHY circuit 110 for calibrating an access control signal (e.g., the data strobe signal DQS or the write clock signal WCK) transmitted to the DDR memory device 100 according to an embodiment of the present invention. In this embodiment, the PHY circuit 110 may comprise the write leveling training circuit 200, a clock generator such as a phase-locked loop (PLL) 210, a transmitting (TX) logic 220 and a receiving (RX) logic 230, where the RX logic 230 is configured to transmit data to the controller 120 shown in FIG. 1 which is not involved in the write leveling training, and details related to the RX logic 230 is omitted here for brevity. As shown in FIG. 2, the PLL 210 is coupled to the write leveling training circuit 200, and the TX logic 220 is coupled to the PLL 210. In this embodiment, the write leveling training circuit 200 is configured to generate at least one phase control signal such as phase control signals D1 and D2, wherein the PLL 210 may receive the phase control signal D1 via a control terminal $CTRL_{DQS}$, and receive the phase control signal D2 via a control terminal $CTRL_{WCK}$. The PLL 210 is configured to output at least one control clock according to the at least one phase control signal. For example, the PLL 210 may output a control clock $CK_{DQS}$ via an output terminal $DQS_{OUT}$ according to the phase control signal D1, and output a control clock $CK_{WCK}$ via an output terminal $WCK_{OUT}$ according to the phase control signal D2. More particularly, a phase of the control clock $CK_{DQS}$ is associated with the phase control signal D1, and a phase of the control clock $CK_{WCK}$ is associated with the phase control signal D2. For example, the PLL 210 may control a phase shift of the control clock $CK_{DQS}$ according to the phase control code D1 and control a phase shift of the control clock $CK_{WCK}$ according to the phase control code D2. In addition, the PLL 210 may output a memory clock CK via an output terminal $CK_{OUT}$ and a command clock $CK_{CMD}$ via an output terminal $CMDCK_{OUT}$, where the memory clock CK may be transmitted to the DDR memory device 100, and the command clock $CK_{CMD}$ may be transmitted to the write leveling training circuit 200 (respective sub-circuits therein) and the TX logic 220. The TX logic 220 is configured to generate the access control signal (e.g., the data strobe signal DQS or the write clock signal WCK) according to the at least one control clock, wherein a phase of the access control signal is associated with the phase of the at least one control clock. For example, a phase of the data strobe signal DQS is associated with the phase of the control clock $CK_{DQS}$, and a phase of the write clock signal WCK is associated with the phase of the control clock $CK_{WCK}$. In this embodiment, the DDR memory device 100 may output a data signal DQ according to a phase error between the memory clock CK and the access control signal (e.g., the data strobe signal DQS or the write clock signal WCK), and the write leveling training circuit 200 may determine a target value of the at least one phase control signal (e.g., the phase control signal D1 or D2) according to the data signal DQ, in order to minimize the phase error between the memory clock CK and the access control signal (e.g., the data strobe signal DQS or the write clock signal WCK).

In this embodiment, the write leveling training circuit 200 may comprise a scan signal controller 201, a phase control circuit 202 and a result recording circuit 204, where the phase control circuit 202 is coupled to the scan signal controller 201, and the result recording circuit is coupled to the scan signal controller 201. The scan signal controller 201 is configured to control operations of the write leveling training circuit 200. The phase control circuit 202 is configured to output the at least one phase control signal (e.g., the phase control signals D1 and D2) according to the control of the scan signal controller 201, where the phase of the access control signal is controlled according to the at least one phase control signal (e.g., the phase of the data strobe signal DQS may be controlled by the phase control signal D1 and the phase of the write clock signal WCK may be controlled by the phase control signal D2), and the DDR memory device 100 may output the data signal DQ according to the phase error between the memory clock CK and the access control signal (e.g., the data strobe signal DQS or the write clock signal WCK). The result recording circuit 204 is configured to receive the data signal DQ from the DDR memory device 100 and record multiple results of the data signal DQ (e.g., results obtained by setting different values of the phase control signal D1 or D2). The scan signal controller determines the target value of the at least one phase control signal (e.g., the phase control signal D1 or D2) according to the multiple results of the data signal DQ, in order to minimize the phase error between the memory clock and the access control signal (e.g., the data strobe signal DQS or the write clock signal WCK).

It should be noted that the DDR memory device 100 may be any of a low power double data rate 4 (LPDDR4) memory device, a low power double data rate 5 (LPDDR5), and any type of a DDR memory device (e.g., a DDR3 memory device, etc.), but the present invention is not limited thereto. When the DDR memory device 100 is the LPDDR4 memory device, the data strobe signal DQS may be transmitted to the LPDDR4 memory device from the PHY circuit 110, for writing data into the LPDDR4 memory device by using the data strobe signal DQS; and the data strobe signal DQS may be transmitted to the PHY circuit 110 from the LPDDR4 memory device for reading data of the LPDDR4 memory device by using the data strobe signal DQS. When the DDR memory device 100 is the LPDDR5 memory device, the write clock signal WCK may be transmitted to the LPDDR5 memory device from the PHY circuit 110, for writing data into the LPDDR5 memory device by using the write clock signal WCK; and the data strobe signal DQS may be transmitted to the PHY circuit 110 from the LPDDR5 memory device for reading data of the LPDDR5 memory device by using the data strobe signal DQS. FIG. 2 illustrates both the data strobe signal DQS and the write clock signal WCK at a same time for better comprehension that the PHY circuit 110 may be applied to both the LPDDR4 memory device and the LPDDR5 memory device (or other types of DDR memory devices such as the DDR3 memory device), where the PHY circuit 110 may output one of the data strobe signal DQS and the write clock signal WCK to the DDR memory device 100 only in response to which type of DDR memory device the DDR memory device 100 is, but the present invention is not limited thereto.

In addition, the write leveling training circuit 200 may further comprises a write leveling controller 203, where the write leveling controller 203 is coupled to the scan signal controller 201. The write leveling controller 203 is configured to output a write leveling training control signal according to a type of the memory device. For example, when the DDR memory device 100 is the LPDDR4 memory device, the scan signal controller 201 may control the write leveling controller 203 to output the write leveling training control signal associated with a protocol of the LPDDR4 memory device. When the DDR memory device 100 is the LPDDR5 memory device, the scan signal controller 201 may control the write leveling controller 203 to output the write leveling training control signal associated with a protocol of the LPDDR5 memory device, but the present invention is not limited thereto. As shown in FIG. 2, the PHY circuit 110 may comprise a selector 240 (which may be a portion of the selector 110M shown in FIG. 1) configured to select one of the write enable signal WRDATAEN and the write leveling training control signal to be transmitted to the TX logic 220 according to a register value REG. More particularly, when the DDR memory device 100 is set to operate in the write leveling training mode, the selector 240 may select the write leveling training control signal output from the write leveling controller 203 for being transmitted to the TX logic 220, and the TX logic 220 may generate the access control signal (e.g., the data strobe signal DQS or the write clock signal WCK) according to the at least one control clock and the write leveling training control signal.

In this embodiment, the at least one control clock may comprise a data strobe control clock such as the control clock $CK_{DQS}$ and a write clock control clock such as the control clock $CK_{WCK}$, where the TX logic 220 may generate the data strobe signal DQS according to the control clock $CK_{DQS}$ and the write leveling training control signal, or generate the write clock signal WCK according to the control clock $CK_{WCK}$ and the write leveling training control signal. In addition, when the write leveling training control signal indicates that the DDR memory device 100 is the LPDDR5 memory device, the TX logic 220 may generate the write clock signal WCK according to the write clock control clock (e.g., the control clock $CK_{WCK}$) and the write leveling training control signal, and the write clock signal WCK may represent the access control signal. When the write leveling training control signal indicates that the DDR memory device 100 is the LPDDR4 memory device, the TX logic may generate the data strobe signal DQS according to the data strobe control clock (e.g., the control clock $CK_{DQS}$) and the write leveling training control signal, and the data strobe signal DQS may represent the access control signal.

In this embodiment, the data signal DQ may indicate whether the phase error between the memory clock CK and the access control signal (e.g., the data strobe signal DQS or the write clock signal WCK) falls in an allowable range. For example, when the phase error between the memory clock CK and the access control signal falls in the allowable range, the DDR memory device 100 may respond the data signal DQ having a logic value "1"; and when phase error between the memory clock CK and the access control signal falls out of the allowable range, the DDR memory device 100 may respond the data signal DQ having a logic value "0". Thus, the write leveling training circuit 200 may determine whether the phase error between the memory clock CK and the access control signal (e.g. the data strobe signal DQS or the write clock signal WCK) falls in the allowable range by checking the logic value of the data signal DQ, but the present invention is not limited thereto.

In this embodiment, the write leveling training circuit 200 may scan the at least one phase control signal (e.g., the phase control signal D1 or D2) with multiple candidate values to make the phase of the access control signal (e.g., the data strobe signal DQS or the write clock signal WCK) be sequentially shifted with multiple candidate phase shifts, where the data signal DQ (e.g., the multiple results thereof) may indicate that one or more qualified phase shifts among the multiple candidate phase shifts make the phase error fall in the allowable range, the one or more qualified phase shifts are respectively associated with one or more qualified values among the multiple candidate values, and the write leveling training circuit 200 (e.g., the scan signal controller 201) may select one of the one or more qualified values to be the target value. For example, the target value selected from the one or more qualified values may correspond to an average value of the one or more qualified phase shifts.

Figure 3:
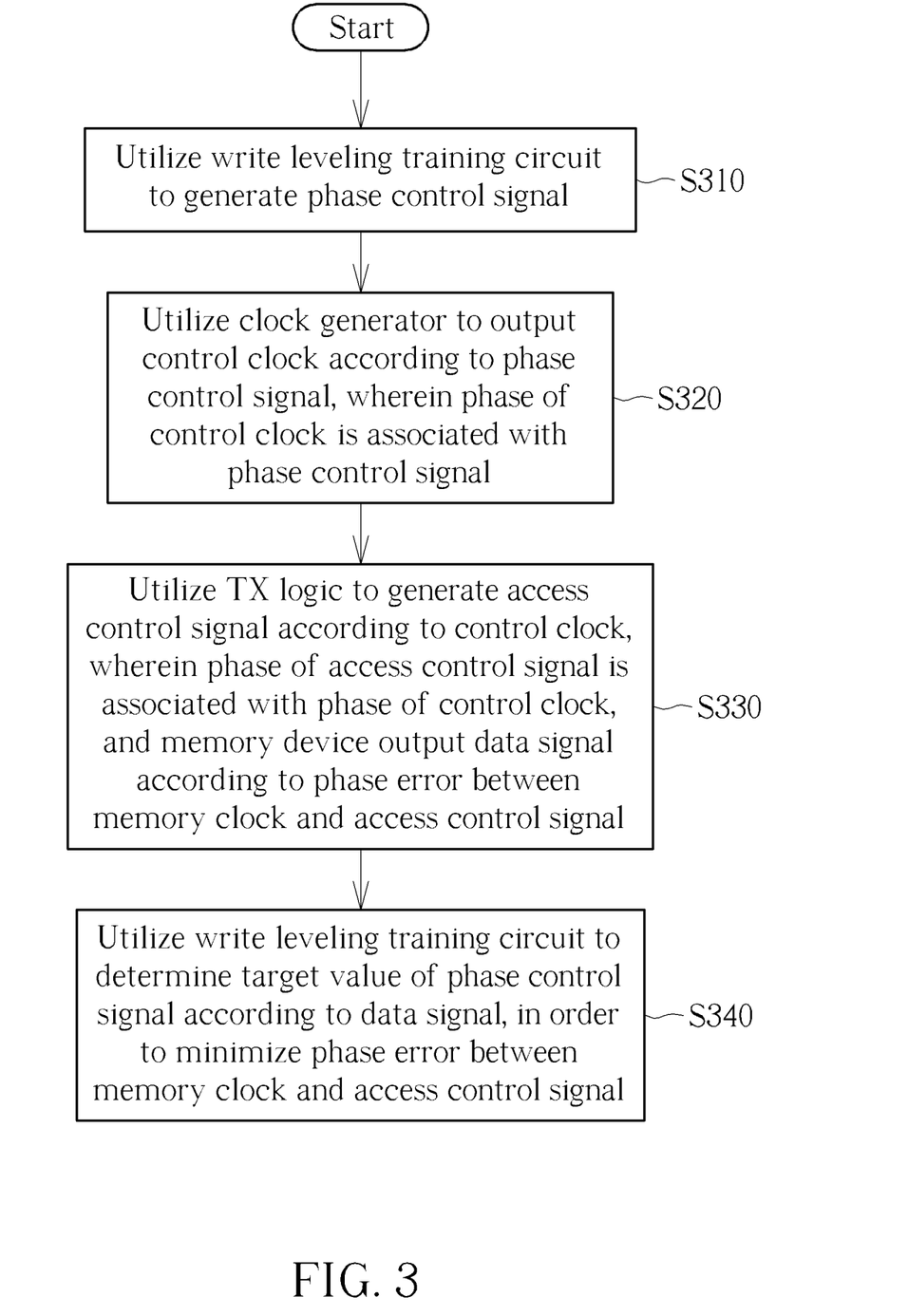
FIG. 3 is a diagram illustrating a working flow of a method for calibrating an access control signal transmitted to a memory device according to an embodiment of the present invention.

FIG. 3 is a diagram illustrating a working flow of a method for calibrating an access control signal (e.g., the data strobe signal DQS or the write clock WCK) transmitted to a memory device (e.g., the DDR memory 100) according to an embodiment of the present invention, where the working flow of the method shown in FIG. 3 may be applicable to a PHY circuit (e.g., the PHY circuit 110 shown in FIG. 2). It should be noted that the working flow shown in FIG. 1 is for illustrative purposes only, and is not meant to be a limitation of the present invention. One or more steps (e.g., steps corresponding to operations related to the PHY circuit 110 illustrated in previous or later embodiments) may be added, deleted or modified in the working flow shown in FIG. 3. In addition, if a same result can be obtained, these steps do not have to be executed in the exact order shown in FIG. 3.

In Step S310, the PHY circuit may utilize a write leveling training circuit thereof (e.g., the write leveling training circuit 200) to generate at least one phase control signal (e.g., the phase control code D1 or D2).

In Step S320, the PHY circuit may utilize a clock generator thereof (e.g., the PLL 210) to output at least one control clock (e.g., the control clock $CK_{DQS}$ or $CK_{WCK}$) according to the at least one phase control signal, wherein a phase of the at least one control clock is associated with the at least one phase control signal.

In Step S330, the PHY circuit may utilize a TX logic (e.g., the TX logic 220) thereof to generate the access control signal according to the at least one control clock, wherein a phase of the access control signal is associated with the phase of the at least one control clock, and the memory device may output a data signal (e.g., the data signal DQ) according to a phase error between a memory clock and the access control signal.

In Step S340, the PHY circuit may utilize the write leveling training circuit to determine a target value of the at least one phase control signal according to the data signal, in order to minimize the phase error between the memory clock and the access control signal.

Figure 4:
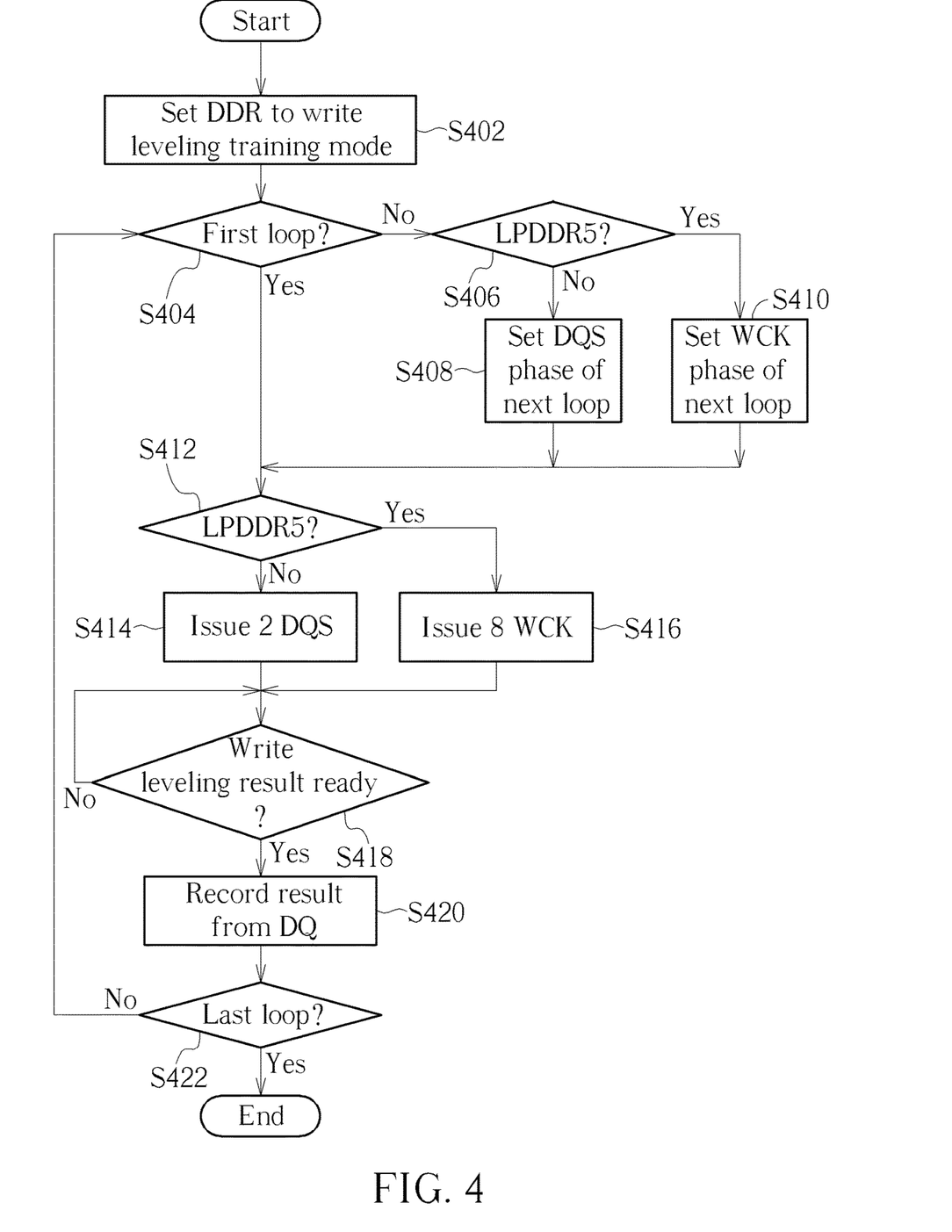
FIG. 4 is a diagram illustrating a working flow of a control scheme of the method shown in FIG. 3 according to an embodiment of the present invention.

FIG. 4 is a diagram illustrating a working flow of a control scheme of the method shown in FIG. 3 according to an embodiment of the present invention, where the control scheme may be executed by the electronic device 10 shown in FIG. 1. It should be noted that the working flow shown in FIG. 4 is for illustrative purposes only, and is not meant to be a limitation of the present invention. One or more steps (e.g., steps corresponding to operations related to the electronic device 10 and the PHY circuit 110 therein illustrated in previous or later embodiments) may be added, deleted or modified in the working flow shown in FIG. 4. In addition, if a same result can be obtained, these steps do not have to be executed in the exact order shown in FIG. 4.

In Step S402, the electronic device 10 (e.g., the CPU or the controller 120) may set the DDR memory device 100 to be in the write leveling training mode (labeled "Set DDR to write leveling training mode" in FIG. 4 for brevity).

In Step S404, the write leveling training circuit 200 (e.g., the scan signal controller 201) may determine whether a present loop is a first loop among multiple loops (labeled "First loop?" in FIG. 4 for brevity), where in each of the multiple loops, the at least one phase control signal (the phase control signal D1 or D2) may be set to one of the multiple candidate values to make the phase of the access control signal (e.g., the data strobe signal DQS or the write clock signal WCK) be shifted with one of the multiple candidate phase shifts. If the determination result shows "Yes", the working flow may proceed with Step S412; and if the determination result shows "No", the working flow may proceed with Step S406.

In Step S406, the write leveling training circuit 200 (e.g., the scan signal controller 201) may determine whether the DDR memory device 100 is the LPDDR5 memory device (labeled "LPDDR5?" in FIG. 4 for brevity). If the determination result shows "Yes", the working flow may proceed with Step S410; and if the determination result shows "No", the working flow may proceed with Step S408.

In Step S408, as the present loop is not the first loop and the DDR memory device 100 is not the LPDDR5 memory device, the write leveling training circuit 200 may set the phase of the data strobe signal DQS to a phase of a next loop of the present loop (labeled "Set DQS phase of next loop" in FIG. 4 for brevity). For example, the write leveling training circuit 200 may change the phase control signal D1 to a next candidate phase value among multiple candidate values of the phase control signal D1 to make the phase of the data strobe signal DQS be shifted with a next candidate phase shift among multiple candidate phase shifts of the data strobe signal DQS, and a result of the data signal DQ corresponding to this candidate value of the phase control signal D1 (or this candidate phase shift of the data strobe signal DQS) may be obtained.

In Step S410, as the present loop is not the first loop and the DDR memory device 100 is the LPDDR5 memory device, the write leveling training circuit 200 may set the phase of the write clock signal WCK to a phase of a next loop of the present loop (labeled "Set WCK phase of next loop" in FIG. 4 for brevity). For example, the write leveling training circuit 200 may change the phase control signal D2 to a next candidate phase value among multiple candidate values of the phase control signal D2 to make the phase of the write clock signal WCK be shifted with a next candidate phase shift among multiple candidate phase shifts of the write clock signal WCK, and a result of the data signal DQ corresponding to this candidate value of the phase control signal D2 (or this candidate phase shift of the write clock signal WCK) may be obtained.

In Step S412, the write leveling training circuit 200 (e.g., the scan signal controller 201) may determine whether the DDR memory device 100 is the LPDDR5 memory device (labeled "LPDDR5?" in FIG. 4 for brevity). If the determination result shows "Yes", the working flow may proceed with Step S416; and if the determination result shows "No", the working flow may proceed with Step S414.

In Step S414, as the DDR memory device 100 is not the LPDDR5 memory device (e.g., being determined as the LPDDR4 memory device), the write leveling training circuit 200 may control the TX logic 220 to issue the data strobe signal DQS with two pulses (labeled "Issue 2 DQS" in FIG. 4 for brevity), which conforms to a protocol defined in LPDDR4 specification.

In Step S416, as the DDR memory device 100 is the LPDDR5 memory device, the write leveling training circuit 200 may control the TX logic 220 to issue the write clock signal WCK with eight pulses (labeled "Issue 8 WCK" in FIG. 4 for brevity), which conforms to a protocol defined in LPDDR5 specification.

In Step S418, the write leveling training circuit 200 (e.g., the result recording circuit 204) may determine whether a write leveling result is ready or not (labeled "Write leveling result ready?" in FIG. 4 for brevity). For example, the write leveling training circuit 200 (e.g., the result recording circuit 204) may check a counter which is configured to count a loop time of this step, and when the loop time reaches a predetermined time period, the write leveling result may be regarded as ready (e.g., the result of the data signal DQ is regarded as being valid). More particularly, if the determination result shows "Yes", the working flow may proceed with Step S420; and if the determination result shows "No", the working flow may return to Step S418.

In Step S420, the writ leveling training circuit 200 (e.g., the result recording circuit 204) may record the write leveling result from the data signal DQ (labeled "Record result from DQ" in FIG. 4 for brevity).

In Step S422, the write leveling training circuit 200 (e.g., the scan signal controller 201) may determine whether the present loop is a last loop among the multiple loops (labeled "Last loop?" in FIG. 4 for brevity). For example, the write leveling training circuit 200 may determine whether a candidate value of the multiple candidate values is a last one of the multiple candidate values. If the determination result shows "Yes", the working flow ends; and if the determination result shows "No", the working flow may proceed with Step S404.

Figure 5:
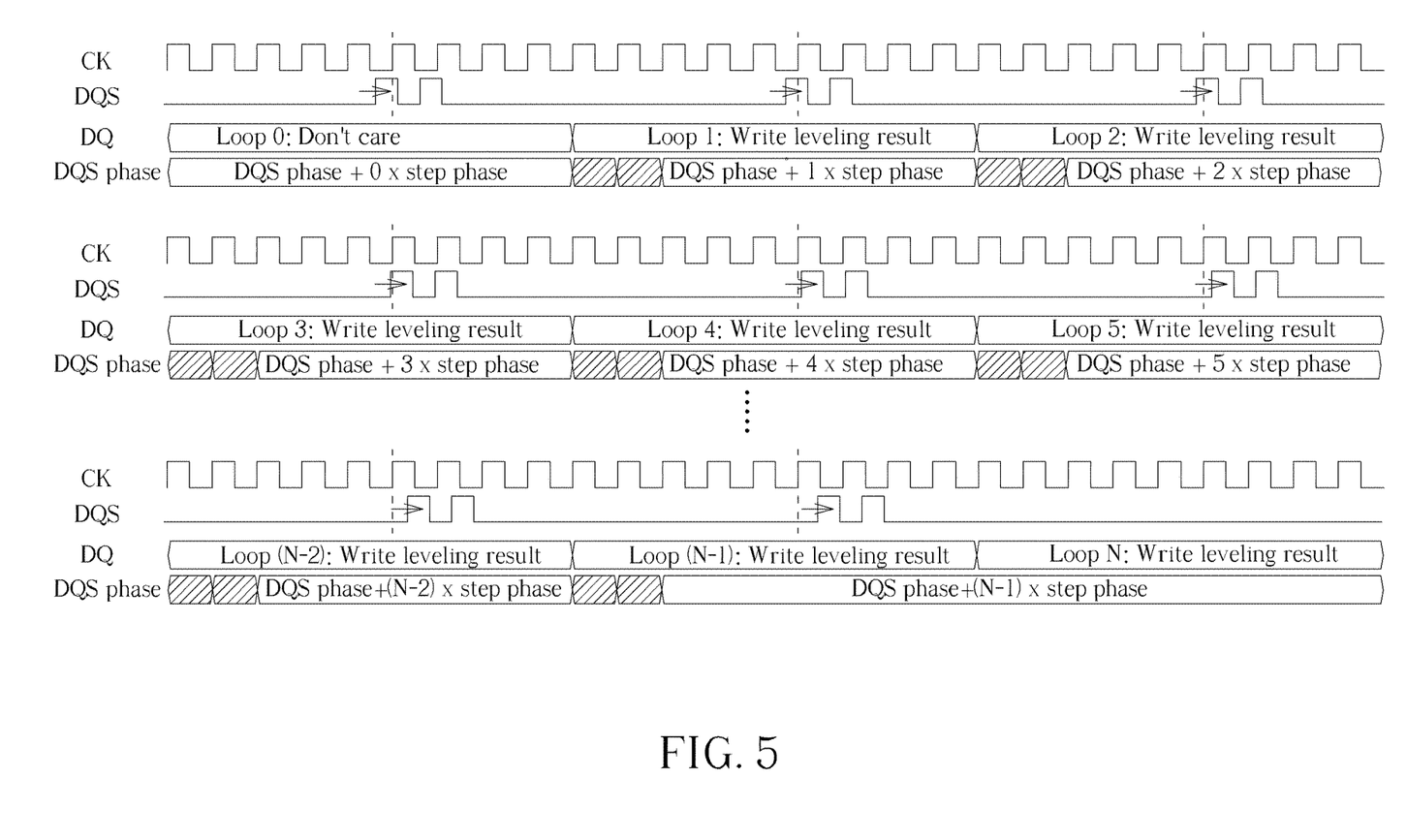
FIG. 5 is a diagram illustrating an example of scanning a phase shift of a data strobe signal according to an embodiment of the present invention.

FIG. 5 is a diagram illustrating an example of scanning a phase shift of the data strobe signal DQS according to an embodiment of the present invention, where a waveform labeled "DQS phase" may represent the phase of the data strobe signal DQS. In this embodiment, the phase shift of the data strobe signal DQS is scanned with N candidate phase shifts (which may be respectively controlled by N candidate values of the phase control signal D1), where each of the N candidate phase shifts of the data strobe signal DQS are respectively applied to the data strobe signal DQS in N loops such as Loop #0, Loop #1, Loop #2, Loop #3, Loop #4, Loop #5, . . . , Loop #(N−2), and Loop #(N−1), and the data strobe signal DQS may carry two pulses in each loop of the N loops. In Loop #0, there is no additional phase shift applied to the data strobe signal DQS (labeled "DQS phase+0×step phase"), and a result of detecting a phase error between the memory clock CK and the data strobe signal DQS of Loop #0 may be recorded in a next loop such as Loop #1 (labeled "Loop 1: Write leveling result"), where a result of the data signal DQ in Loop #0 is invalid (labeled "Loop 0: Don't care") as Loop #0 is a first loop of the N loops. In Loop #1, one times a step phase of the data strobe signal DQS is applied to the data strobe signal DQS (labeled "DQS phase+ 1×step phase"), and a result of detecting a phase error between the memory clock CK and the data strobe signal DQS of Loop #1 may be recorded in a next loop such as Loop #2 (labeled "Loop 2: Write leveling result"). In Loop #2, two times the step phase of the data strobe signal DQS is applied to the data strobe signal DQS (labeled "DQS phase+2×step phase"), and a result of detecting a phase error between the memory clock CK and the data strobe signal DQS of Loop #2 may be recorded in a next loop such as Loop #3 (labeled "Loop 3: Write leveling result"). In Loop #3, three times the step phase of the data strobe signal DQS is applied to the data strobe signal DQS (labeled "DQS phase+3×step phase"), and a result of detecting a phase error between the memory clock CK and the data strobe signal DQS of Loop #3 may be recorded in a next loop such as Loop #4 (labeled "Loop 4: Write leveling result"). In Loop #4, four times the step phase of the data strobe signal DQS is applied to the data strobe signal DQS (labeled "DQS phase+4×step phase"), and a result of detecting a phase error between the memory clock CK and the data strobe signal DQS of Loop #4 may be recorded in a next loop such as Loop #5 (labeled "Loop 5: Write leveling result"). In Loop #5, five times the step phase of the data strobe signal DQS is applied to the data strobe signal DQS (labeled "DQS phase+5×step phase"), and a result of detecting a phase error between the memory clock CK and the data strobe signal DQS of Loop #5 may be recorded in a next loop, where the rest may be deduced by analogy. For example, in Loop #(N−2), (N−2) times the step phase of the data strobe signal DQS is applied to the data strobe signal DQS (labeled "DQS phase+ (N−2)×step phase"), and a result of detecting a phase error between the memory clock CK and the data strobe signal DQS of Loop #(N−2) may be recorded in a next loop such as Loop #(N−1) (labeled "Loop (N−1): Write leveling result"). In Loop #(N−1), (N−1) times the step phase of the data strobe signal DQS is applied to the data strobe signal DQS (labeled "DQS phase+ (N−1)×step phase"), and a result of detecting a phase error between the memory clock CK and the data strobe signal DQS of Loop #(N−1) may be recorded in a next loop such as Loop #N (labeled "Loop N: Write leveling result"). After all results of applying the above phase shifts of the data strobe signal DQS are obtained, the write leveling training circuit 200 (e.g., the scan signal controller 201) may select one of qualified values which makes the phase error between the memory clock CK and the data strobe signal DQS fall in the allowable range (by selecting an average of the qualified values), to be the target value which is expected to have a minimized phase error between the memory clock CK and the data strobe signal DQS.

In this embodiment, a jump of one step phase between the phase of the data strobe signal DQS at a present loop and the phase of the data strobe signal DQS at a next loop does not have to be completed in one jump of the phase control code D1. One or more buffering states (illustrated by shading in FIG. 5) may be added when the PLL 210 is not preferred to complete switching of the phase shift in one jump of the phase control code D1, but the present invention is not limited thereto.

Figure 6:
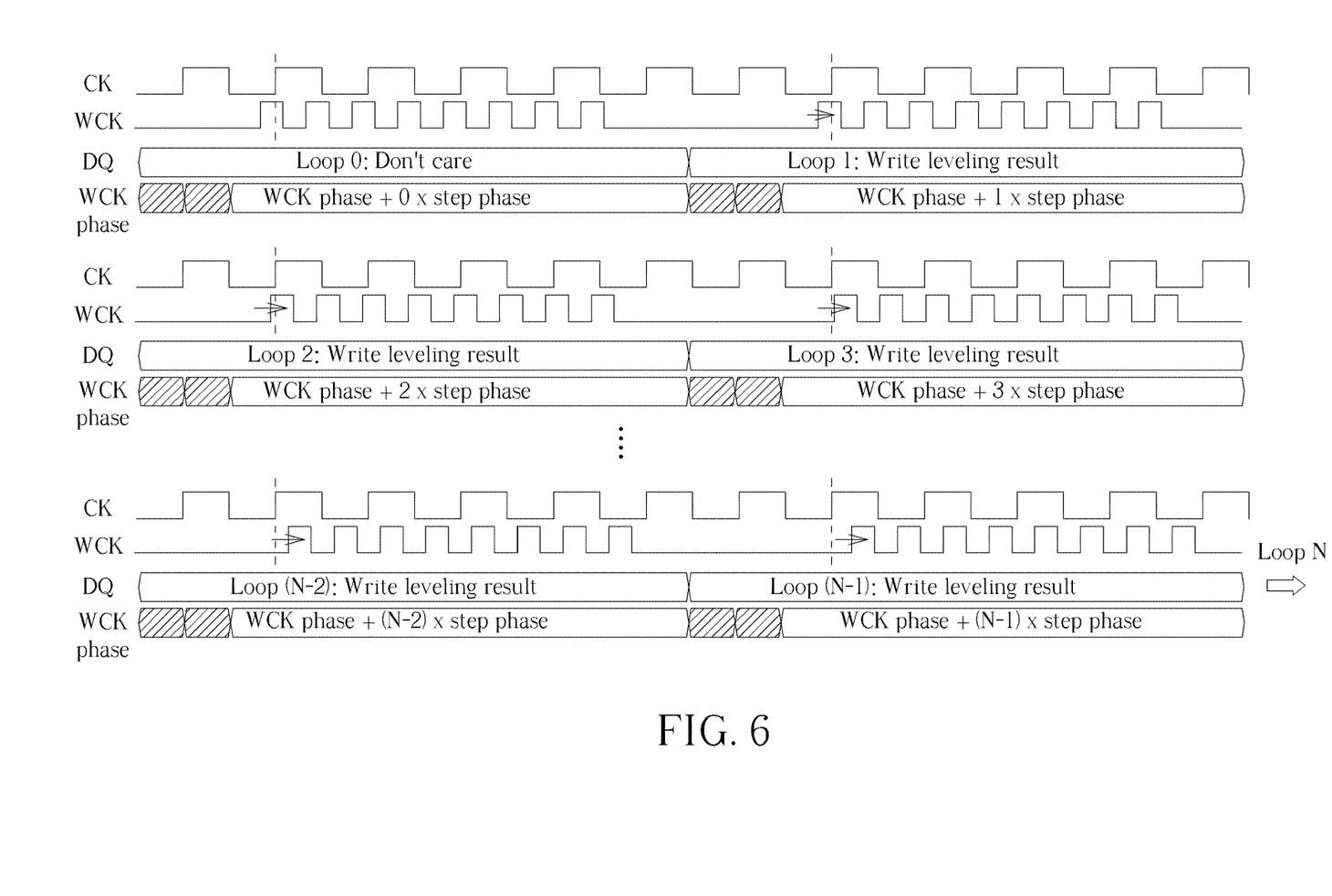
FIG. 6 is a diagram illustrating an example of scanning a phase shift of a write clock signal according to an embodiment of the present invention.

FIG. 6 is a diagram illustrating an example of scanning a phase shift of the write clock signal WCK according to an embodiment of the present invention, where a waveform labeled "WCK phase" may represent the phase of the write clock signal WCK. In this embodiment, the phase shift of the write clock signal WCK is scanned with N candidate phase shifts (which may be respectively controlled by N candidate values of the phase control signal D2), where each of the N candidate phase shifts of the write clock signal WCK are respectively applied to the write clock signal WCK in N loops such as Loop #0, Loop #1, Loop #2, Loop #3, Loop #4, Loop #5, . . . , Loop #(N−2), and Loop #(N−1), and the write clock signal WCK may carry eight pulses in each loop of the N loops. In Loop #0, there is no additional phase shift applied to the write clock signal WCK (labeled "WCK phase+0×step phase"), and a result of detecting a phase error between the memory clock CK and the write clock signal WCK of Loop #0 may be recorded in a next loop such as Loop #1 (labeled "Loop 1: Write leveling result"), where a result of the data signal DQ in Loop #0 is invalid (labeled "Loop 0: Don't care") as Loop #0 is a first loop of the N loops. In Loop #1, one times a step phase of the write clock signal WCK is applied to the write clock signal WCK (labeled "WCK phase+1×step phase"), and a result of detecting a phase error between the memory clock CK and the write clock signal WCK of Loop #1 may be recorded in a next loop such as Loop #2 (labeled "Loop 2: Write leveling result"). In Loop #2, two times the step phase of the write clock signal WCK is applied to the write clock signal WCK (labeled "WCK phase+2×step phase"), and a result of detecting a phase error between the memory clock CK and the write clock signal WCK of Loop #2 may be recorded in a next loop such as Loop #3 (labeled "Loop 3: Write leveling result"). In Loop #3, three times the step phase of the write clock signal WCK is applied to the write clock signal WCK (labeled "WCK phase+3×step phase"), and a result of detecting a phase error between the memory clock CK and the write clock signal WCK of Loop #3 may be recorded in a next loop, where the rest may be deduced by analogy. For example, in Loop #(N−2), (N−2) times the step phase of the write clock signal WCK is applied to the write clock signal WCK (labeled "WCK phase+ (N−2)×step phase"), and a result of detecting a phase error between the memory clock CK and the write clock signal WCK of Loop #(N−2) may be recorded in a next loop such as Loop #(N−1) (labeled "Loop (N−1): Write leveling result"). In Loop #(N−1), (N−1) times the step phase of the write clock signal WCK is applied to the write clock signal WCK (labeled "WCK phase+ (N−1)× step phase"), and a result of detecting a phase error between the memory clock CK and the write clock signal WCK of Loop #(N−1) may be recorded in a next loop such as Loop #N (labeled "Loop N", where the waveform is not shown for brevity). After all results of applying the above phase shifts of the write clock signal WCK are obtained, the write leveling training circuit 200 (e.g. the scan signal controller 201) may select one of qualified values which makes the phase error between the memory clock CK and the write clock signal WCK fall in the allowable range (by selecting an average of the qualified values), to be the target value which is expected to have a minimized phase error between the memory clock CK and the write clock signal WCK.

In this embodiment, a jump of one step phase between the phase of the write clock signal WCK at a present loop and the phase of the write clock signal WCK at a next loop does not have to be completed in one jump of the phase control code D2. One or more buffering states (illustrated by shading in FIG. 6) may be added when the PLL 210 is not preferred to complete switching of the phase shift in one jump of the phase control code D2, but the present invention is not limited thereto.

To summarize, the PHY circuit 110, the write leveling training circuit 200 therein and the method provided by the embodiment of the present invention can execute detection and calibration of the access control signals (e.g. the data strobe signal DQS or the write clock signal WCK) in hardware level with proper software control, which greatly improve efficiency of the write leveling training of the DDR memory device 100. In addition, the embodiment of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A physical layer (PHY) circuit for calibrating an access control signal transmitted to a memory device, comprising:
a write leveling training circuit, configured to generate at least one phase control signal;
a clock generator, coupled to the write leveling training circuit, configured to output at least one control clock according to the at least one phase control signal, wherein a phase of the at least one control clock is associated with the at least one phase control signal;
a transmitting (TX) logic, coupled to the clock generator, configured to generate the access control signal according to the at least one control clock, wherein a phase of the access control signal is associated with the phase of the at least one control clock;
wherein the memory device outputs a data signal according to a phase error between a memory clock and the access control signal, and the write leveling training circuit determines a target value of the at least one phase control signal according to the data signal, in order to minimize the phase error between the memory clock and the access control signal.

2. The PHY circuit of claim 1, wherein the data signal indicates whether the phase error between the memory clock and the access control signal falls in an allowable range.

3. The PHY circuit of claim 2, wherein the write leveling training circuit scans the at least one phase control signal with multiple candidate values to make the phase of the access control signal be sequentially shifted with multiple candidate phase shifts, the data signal indicates that one or more qualified phase shifts among the multiple candidate phase shifts make the phase error fall in the allowable range, the one or more qualified phase shifts are respectively associated with one or more qualified values among the multiple candidate values, and the write leveling training circuit selects one of the one or more qualified values to be the target value.

4. The PHY circuit of claim 3, wherein the target value selected from the one or more qualified values corresponds to an average value of the one or more qualified phase shifts.

5. The PHY circuit of claim 1, wherein the write leveling training circuit comprises:
a scan signal controller, configured to control operations of the write leveling training circuit;
a phase control circuit, coupled to the scan signal controller, configured to output the at least one phase control signal according to the control of the scan signal controller; and
a result recording circuit, coupled to the scan signal controller, configured to receive the data signal from the memory device and record multiple results of the data signal;
wherein the scan signal controller determines the target value according to the multiple results of the data signal.

6. The PHY circuit of claim 5, wherein the write leveling training circuit further comprises:
a write leveling controller, coupled to the scan signal controller, configured to output a write leveling training control signal according to a type of the memory device;
wherein when the memory device is set to operate in a write leveling training mode, the TX logic generates the access control signal according to the at least one control clock and the write leveling training control signal.

7. The PHY circuit of claim 6, wherein the at least one control clock comprises a data strobe control clock and a write clock control clock, and the TX logic generates a data strobe signal according to the data strobe control clock and the write leveling training control signal or generates a write clock signal according to the write clock control clock and the write leveling training control signal.

8. The PHY circuit of claim 7, wherein when the write leveling training control signal indicates that the memory device is a low power double data rate 5 (LPDDR5) memory device, the TX logic generates the write clock signal according to the write clock control clock and the write leveling training control signal, and the write clock signal represents the access control signal.

9. The PHY circuit of claim 7, wherein when the write leveling training control signal indicates that the memory device is a low power double data rate 4 (LPDDR4) memory device, the TX logic generates the data strobe signal according to the data strobe control clock and the write leveling training control signal, and the data strobe signal represents the access control signal.

10. A write leveling training circuit for calibrating an access control signal transmitted to a memory device, comprising:
- a scan signal controller, configured to control operations of the write leveling training circuit;
- a phase control circuit, coupled to the scan signal controller, configured to output at least one phase control signal according to control of the scan signal controller, wherein a phase of the access control signal is controlled according to the at least one phase control signal, and the memory device outputs a data signal according to a phase error between a memory clock and the access control signal;
- a result recording circuit, coupled to the scan signal controller, configured to receive the data signal from the memory device and record multiple results of the data signal;
- wherein the scan signal controller determines a target value of the at least one phase control signal according to the multiple results of the data signal, in order to minimize the phase error between the memory clock and the access control signal.

11. The write leveling training circuit of claim 10, wherein the data signal indicates whether the phase error between the memory clock and the access control signal falls in an allowable range.

12. A method for calibrating an access control signal transmitted to a memory device, applicable to a physical layer (PHY) circuit, comprising:
- utilizing a write leveling training circuit of the PHY circuit to generate at least one phase control signal;
- utilizing a clock generator of the PHY circuit to output at least one control clock according to the at least one phase control signal, wherein a phase of the at least one control clock is associated with the at least one phase control signal;
- utilizing a transmitting (TX) logic of the PHY circuit to generate the access control signal according to the at least one control clock, wherein a phase of the access control signal is associated with the phase of the at least one control clock, and the memory device outputs a data signal according to a phase error between a memory clock and the access control signal; and
- utilizing the write leveling training circuit to determine a target value of the at least one phase control signal according to the data signal, in order to minimize the phase error between the memory clock and the access control signal.

13. The method of claim 12, wherein the data signal indicates whether the phase error between the memory clock and the access control signal falls in an allowable range.

14. The method of claim 13, wherein utilizing the write leveling training circuit of the PHY circuit to generate the at least one phase control signal comprises:
- scanning the at least one phase control signal with multiple candidate values to make the phase of the access control signal be sequentially shifted with multiple candidate phase shifts;
- wherein the data signal indicates that one or more qualified phase shifts among the multiple candidate phase shifts make the phase error fall in the allowable range, the one or more qualified phase shifts are respectively associated with one or more qualified values among the multiple candidate values, and one of the one or more qualified values is selected to be the target value.

15. The method of claim 14, wherein the target value selected from the one or more qualified values corresponds to an average value of the one or more qualified phase shifts.

16. The method of claim 12, wherein utilizing the write leveling training circuit of the PHY circuit to generate at least one phase control signal comprises utilizing a phase control circuit of the write leveling training circuit to output the at least one phase control signal; and utilizing the write leveling training circuit to determine the target value of the at least one phase control signal according to the data signal in order to minimize the phase error between the memory clock and the access control signal comprises utilizing a result recording circuit of the write leveling training circuit to receive the data signal from the memory device and record multiple results of the data signal, wherein the target value is determined according to the multiple results of the data signal.

17. The method of claim 16, further comprising:
- utilizing the write leveling training circuit to output a write leveling training control signal according to a type of the memory device;
- in response to the memory device being set to operate in a write leveling training mode, utilizing the TX logic to generate the access control signal according to the at least one control clock and the write leveling training control signal.

18. The method of claim 17, wherein the at least one control clock comprises a data strobe control clock and a write clock control clock, and utilizing the TX logic of the PHY circuit to generate the access control signal according to the at least one control clock comprises:
- utilizing the TX logic to generate a data strobe signal according to the data strobe control clock and the write leveling training control signal or generate a write clock signal according to the write clock control clock and the write leveling training control signal.

19. The method of claim 18, wherein utilizing the TX logic of the PHY circuit to generate the access control signal according to the at least one control clock further comprises:
- in response to the write leveling training control signal indicating that the memory device is a low power double data rate 5 (LPDDR5) memory device, utilizing the TX logic to generate the write clock signal according to the write clock control clock and the write leveling training control signal;
- wherein the memory device outputs the data signal according to a write clock phase error between the memory clock and the write clock signal.

20. The method of claim 19, wherein utilizing the TX logic of the PHY circuit to generate the access control signal according to the at least one control clock further comprises:
- in response to the write leveling training control signal indicating that the memory device is a low power double data rate 4 (LPDDR4) memory device, utilizing the TX logic to generate the data strobe signal according to the data strobe control clock and the write leveling training control signal;
- wherein the memory device outputs the data signal according to a data strobe phase error between the memory clock and the data strobe signal.

\* \* \* \* \*